US009729365B2

(12) United States Patent
Nyenhuis

(10) Patent No.: US 9,729,365 B2
(45) Date of Patent: Aug. 8, 2017

(54) DARC SIGNAL DEMODULATION CIRCUIT ARRANGEMENT AND METHOD FOR OPERATING SAME

(71) Applicant: Robert Bosch GmbH, Stuttgart (DE)

(72) Inventor: Detlev Nyenhuis, Sibbesse (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/123,057

(22) PCT Filed: Feb. 2, 2015

(86) PCT No.: PCT/EP2015/052060
§ 371 (c)(1),
(2) Date: Sep. 1, 2016

(87) PCT Pub. No.: WO2015/132026
PCT Pub. Date: Sep. 11, 2015

(65) Prior Publication Data
US 2016/0373280 A1    Dec. 22, 2016

(30) Foreign Application Priority Data
Mar. 6, 2014 (DE) .................. 10 2014 204 151

(51) Int. Cl.
*H04L 27/22*   (2006.01)
*H04L 27/227*  (2006.01)
(Continued)

(52) U.S. Cl.
CPC ........... *H04L 27/227* (2013.01); *H03D 3/007* (2013.01); *H04B 1/16* (2013.01); *H04B 1/1646* (2013.01);
(Continued)

(58) Field of Classification Search
CPC ............. H04L 27/227; H04L 27/2272; H04L 27/2273; H04L 27/2275; H04L 27/2276;
(Continued)

(56) References Cited

U.S. PATENT DOCUMENTS 4,592,075 A  *  5/1986  Tsukamoto  ......... H04L 27/2273
                                                329/307
4,827,515 A     5/1989  Reich
(Continued)

FOREIGN PATENT DOCUMENTS

EP       0627834      11/2009

OTHER PUBLICATIONS

International Search Report for PCT/EP2015/052060, issued May 8, 2015.

*Primary Examiner* — Siu Lee
(74) *Attorney, Agent, or Firm* — Norton Rose Fulbright US LLP; Gerard Messina

(57) ABSTRACT

A DARC signal demodulation circuit assemblage for recovering a DARC signal (DARC data) from an FM multiplex transmission signal includes: a pilot tone regulation circuit to obtain first and second mutually orthogonal oscillation synchronous with a stereo pilot tone encompassed by the FM multiplex transmission signal; a frequency quadruplication section for obtaining third and fourth mutually orthogonal oscillation having a frequency quadrupled as to the stereo pilot tone; a first multiplication section for obtaining a first multiplication signal from the FM multiplex transmission signal and from the third oscillation; a second multiplication section for obtaining a second multiplication signal from the FM multiplex transmission signal and from the fourth oscillation; first/second low-pass filters for obtaining first/second DARC signal components by low-pass filtration of the first and second multiplication signals; and an FM demodulation section for obtaining the DARC signal
(Continued)

from a frequency demodulation of the first/second DARC signal components.

11 Claims, 4 Drawing Sheets

(51) Int. Cl.
*H03D 3/00* (2006.01)
*H04B 1/16* (2006.01)
*H04B 1/30* (2006.01)
*H04L 27/20* (2006.01)

(52) U.S. Cl.
CPC ........... H04B 1/30 (2013.01); H04L 27/2014 (2013.01); *H04H 2201/13* (2013.01)

(58) Field of Classification Search
CPC .. H04B 1/16; H04H 2201/00; H04H 2201/11; H04H 2201/13; H04H 2201/16; H04H 2201/183; H04H 2201/19
USPC ....... 375/316, 334, 336, 340, 346, 354, 359, 375/362, 364, 365, 370, 371, 373, 376
See application file for complete search history.

(56) References Cited

U.S. PATENT DOCUMENTS

| | | | | |
|---|---|---|---|---|
| 5,473,290 A | * | 12/1995 | Scomazzon | H04H 20/34 332/103 |
| 5,507,024 A | | 4/1996 | Richards, Jr. | |
| 2006/0062363 A1 | * | 3/2006 | Albrett | G06Q 30/02 379/101.01 |
| 2006/0241196 A1 | * | 10/2006 | Magnet | C09D 5/185 521/82 |

* cited by examiner

DARC SIGNAL DEMODULATION CIRCUIT ARRANGEMENT AND METHOD FOR OPERATING SAME

FIELD OF THE INVENTION

The present invention relates to a Data Radio Channel (DARC) signal demodulation circuit arrangement and method for operating same.

SUMMARY OF THE INVENTION

The object of the invention is to improve and simplify a DARC signal demodulation circuit assemblage, in particular in an FM multiplex broadcast receiver, for recovering DARC data from an FM multiplex transmission signal, and a method for operating that DARC signal demodulation circuit assemblage.

This object may be achieved by a DARC signal demodulation circuit assemblage, in particular in an FM multiplex broadcast receiver, for recovering a DARC signal, containing DARC data, from an FM multiplex transmission signal. This DARC signal demodulation circuit assemblage encompasses: a pilot tone regulation circuit configured to obtain a first and a second mutually orthogonal oscillation synchronous with a stereo pilot tone encompassed by the FM multiplex transmission signal; a frequency quadruplication section for obtaining a third and a fourth mutually orthogonal oscillation having a frequency quadrupled with respect to the stereo pilot tone; a first multiplication section for obtaining a first multiplication signal from the FM multiplex transmission signal and from the third oscillation; a second multiplication section for obtaining a second multiplication signal from the FM multiplex transmission signal and from the fourth oscillation; a first low-pass filter for obtaining a first DARC signal component by low-pass filtration of the first multiplication signal; a second low-pass filter for obtaining a second DARC signal component by low-pass filtration of the second multiplication signal; and an FM demodulation section for obtaining the DARC signal from a frequency demodulation of the first and the second DARC signal component.

The term "frequency modulated" is abbreviated here, as usual, as "FM." The FM multiplex transmission signal is a broadcast signal, which may be a stereo broadcast signal, onto which is overlaid an additional, data-containing signal in particular using the so-called level control minimum frequency shift keying (L-MSK) method. This data-containing signal according to the DARC system, referred to as a "DARC signal," is modulated onto the broadcast signal on an subcarrier oscillation at 76 kHz by the fact that the subcarrier oscillation is switched over, for the duration of one respective oscillation period of a 16-kHz clock signal, selectably to 72 kHz or 80 kHz depending on the data to be transmitted. The DARC signal and the remaining components of the broadcast signal, such as the mono audio signal, the stereo pilot tone present as a subcarrier oscillation at 19 kHz, stereo difference signal, and RDS signal, constitute the FM multiplex transmission signal when superimposed. The latter can be present in analog form; however, a digitized form of the FM multiplex transmission signal, which has a sampling rate of at least 200 kHz and a resolution of, for example 16 bits, may be processed.

The pilot tone regulation circuit is configured to deliver the FM multiplex transmission signal and to regulate the stereo pilot tone present therein as a subcarrier oscillation at 19 kHz. The frequency quadruplication section following the pilot tone regulation circuit encompasses a circuit assemblage for frequency multiplication, here in particular quadruplication, that advantageously is embodied from an application of sine and cosine addition theorems, according to which the sine and cosine of a multiple of a specific argument are calculated from products and sums respectively of the sine and cosine of that argument.

The first and/or second low-pass filter respectively for filtration of the first and the second multiplication signal serves to suppress undesired and unnecessary harmonics that are formed in the context of signal multiplication. These low-pass filters may be embodied adjustably in terms of their limit frequency. An adjustability of the limit frequency in the range of approximately 4 kHz to approx. 16 kHz particularly may be used. The suppression of undesired signal components, which are obtrusive at this location, can thereby be optimally selected.

The invention makes possible a simple and precisely operating circuit assemblage for obtaining the DARC signal, in particular in the context of the processing of digitized FM multiplex transmission signals, with high signal quality, i.e. with a high signal amplitude and high signal-to-noise ratio. Particularly advantageously, it is possible to use an FM demodulator of any usual, known design in this context, resulting in a very simple and reliable configuration.

Advantageous embodiments of the DARC signal demodulation circuit assemblage according to the present invention are characterized in the dependent claims internally referred thereto.

According to a refinement of the DARC signal demodulation circuit assemblage according to the present invention, the pilot tone regulation circuit is embodied with a phase-locked loop to be latched onto the stereo pilot tone. The embodiment with a phase-locked loop (PLL) ensures accurate, stable, dependable operation with a simple circuit configuration.

In a further embodiment of the DARC signal demodulation circuit assemblage according to the present invention, a clock signal derivation section, coupled to the pilot tone regulation circuit, is provided in order to derive, in frequency- and phase-accurate manner with respect to the stereo pilot tone, a clock signal for obtaining the DARC data from the DARC signal. This embodiment makes possible, in a simple manner, very accurate derivation of the clock signal in terms of frequency and phase, i.e. very accurate conformity with the desired frequency and phase of the clock signal with respect to the stereo pilot tone. The result thereof is also precise operation in the context of recovery, subsequent to demodulation, of the DARC data from the DARC signal, and subsequent DARC decoding.

A refinement of the DARC signal demodulation circuit assemblage according to the present invention is characterized by a propagation time element, downstream from the clock signal derivation section, for delaying the clock signal by an amount equal to a predefinable signal propagation time. The propagation time element allows precise establishment of a desired phase relationship between the clock signal delayed thereby and the DARC signal, and thereby increases the precision with which the DARC data are recovered.

According to another embodiment of the DARC signal demodulation circuit assemblage according to the present invention, the pilot tone regulation circuit encompasses a control signal generation section having: a third multiplication section for obtaining a third multiplication signal from the FM multiplex transmission signal and from the first oscillation; a fourth multiplication section for obtaining a fourth multiplication signal from the FM multiplex transmission signal and from the second oscillation; a fifth multiplication section for obtaining a fifth multiplication signal from the third and the fourth multiplication signal; and a threshold value circuit for constituting a control signal from the fifth multiplication signal. The pilot tone regulation circuit furthermore encompasses in this context an oscillation generator for constituting the first and the second oscillation, in a manner controlled by the control signal, by polynomial approximation. A third and a fourth low-pass filter may be also provided for low-pass filtration respectively of the third and the fourth multiplication signal before the fifth multiplication signal is constituted, in order to filter out undesired harmonic components respectively in the third and the fourth multiplication signal before they are further processed.

A first segment of the pilot tone regulation circuit is thus configured to constitute the control signal from a signal multiplication of the FM multiplex transmission signal by the first and the second oscillation constituted by the pilot tone regulation circuit; for this, said oscillation is fed back to the third and the fourth multiplication sections which function as input sections of the pilot tone regulation circuit.

The polynomial approximation to the sine and cosine function, for the execution of which the oscillation generator is configured, is based on a representation of the angle functions by polynomials whose polynomial coefficients are ascertained, for example, from a method of least error squares and thus simulate the sine and cosine function more accurately than, for example, the first summands of a power series expansion of the aforesaid angle functions. In order to approximate the angle function that is to be constituted, the oscillation generator is configured to produce a signal profile from the summands of the relevant polynomial only in a narrow value range of the argument of the angle function, e.g. from −0.5*pi to +0.5*pi, where pi=3.14 . . . is the mathematical constant n; in the remainder of the value range of the argument, the relevant angle function repeats periodically and with alternating sign. These approximations to the angle functions, in particular sine and cosine, using polynomials with limited numbers of summands are also referred to as "polynomial approximations". Oscillation profiles constituting an approximation to the sine and cosine can thereby be simulated sufficiently accurately with comparatively little outlay. If the argument of the polynomial is modified over time, the oscillation generator yields the first and the second oscillation with that time dependence. Especially in an embodiment for processing digitized signals, the circuit provided for constituting the time-variable argument are ones with which an increment for modifying the argument over time, as well as a phase error compensation, are incorporated into the constitution of the argument in addition to the control signal.

Particularly, the control signal generated in the pilot tone regulation circuit simultaneously may also serve, after scaling for adaptation to the modified frequency, for generation of the clock signal, so that slaving of this control signal to the frequency- and phase-accurate regulation of the first and the second oscillation also automatically causes correction of the clock signal, so that without further measures, the pilot tone regulation circuit is also configured to supply the clock signal with very accurate conformity with the desired frequency and phase with respect to the stereo pilot tone.

The object recited previously is furthermore achieved, and the advantages explained above are arrived at, by way of a method for operating a DARC signal demodulation circuit assemblage embodied in a manner described above, in which in order to recover a DARC signal, containing DARC data, from an FM multiplex transmission signal: a first and a second mutually orthogonal oscillation synchronous with a stereo pilot tone encompassed by the FM multiplex transmission signal are obtained; a third and a fourth mutually orthogonal oscillation having quadruple the frequency of the stereo pilot tone are obtained from the first and the second oscillation by frequency quadruplication; a first multiplication signal is obtained from the FM multiplex transmission signal and from the third oscillation by signal multiplication; and a second multiplication signal is obtained from the FM multiplex transmission signal and from the fourth oscillation; by low-pass filtration, a first DARC signal component is obtained from the first multiplication signal, and a second DARC signal component is obtained from the second multiplication signal; and the DARC signal is obtained from a frequency demodulation of the first and the second DARC signal component.

In an advantageous refinement of the method according to the present invention, a clock signal for obtaining the DARC data from the DARC signal is derived from the stereo pilot tone in frequency- and phase-accurate manner with respect to the stereo pilot tone, thereby enabling very accurate conformity with the desired frequency and phase of the clock signal with respect to the stereo pilot tone.

The object recited previously is furthermore achieved by a computer program product that has program parts for executing a method of the kind described above; by a machine-readable, in particular computer-readable, data structure that is generated by such a method and/or by at least one such computer program product; and by a machine-readable, in particular computer-readable, data medium on which at least one such computer program product is recorded and/or stored, and/or on which at least one such data structure is kept on hand for retrieval. The subject matter of the invention can thus be realized both by an individual compilation of a single circuit-engineering arrangement, for example in the form of an analog computer, and by a circuit assemblage for processing digitized signals which is individually adapted to the specific signal processing steps to be carried out, for example in the form of a specially embodied digital signal processor.

Exemplifying embodiments of the invention are depicted in the drawings and will be described in further detail below; corresponding elements in all Figures are labeled with the same reference characters, and repeated description of those elements is omitted.

DETAILED DESCRIPTION

Figure 1:
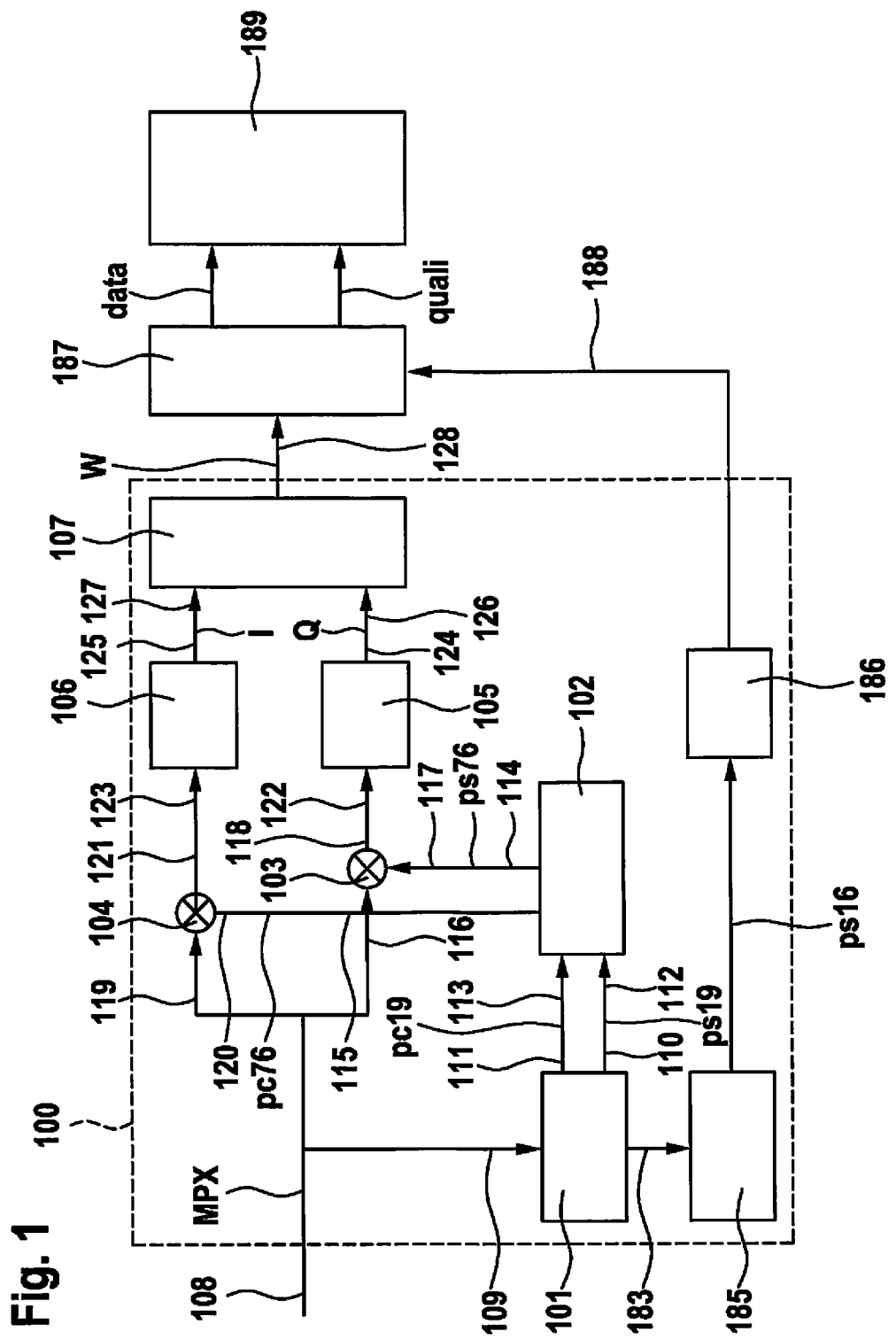
FIG. 1 shows an example of a DARC signal demodulation circuit assemblage according to the present invention, depicted as an overview block diagram.

FIG. 1 is an overview block diagram showing an exemplifying embodiment of a DARC signal demodulation circuit assemblage 100 according to the present invention, hereinafter referred to simply as a "DARC demodulator," which may be embodied for use in an FM multiplex broadcast receiver in order to recover a DARC signal W, containing DARC data labeled data, from an FM multiplex transmission signal MPX (or simply "MPX signal"). DARC demodulator 100 encompasses a pilot tone regulation circuit 101, a frequency quadruplication section 102, a first 103 and a second multiplication section 104, a first 105 and a second low-pass filter 106, and an FM demodulation section 107. The FM multiplex transmission signal MPX is conveyed during operation, from a broadcast receiving section (not depicted) of particularly usual configuration, to an input terminal 108 of DARC demodulator 100 and to an input terminal 109, connected thereto, of pilot tone regulation circuit 101. The MPX signal is already present in the baseband and encompasses a stereo pilot tone, i.e. a subcarrier oscillation having a frequency of 19 kHz. This too is delivered to pilot tone regulation circuit 101 at its input 109. Pilot tone regulation circuit 101 is configured to adjust to and latch onto the stereo pilot tone at 19 kHz, and thus oscillates synchronously with the stereo pilot tone at 19 kHz. In the pilot tone regulation circuit, a first oscillation labeled ps19 and a second oscillation labeled pc19, synchronous with the stereo pilot tone and orthogonal to one another, i.e. phase-shifted by 90° with respect to each other, are obtained and are emitted respectively at a first and a second output terminal 110, 111. First and second oscillation ps19, pc19 are delivered respectively to a first and a second input terminal 112, 113 of frequency quadruplication section 102. A third oscillation ps76 and a fourth oscillation pc76, mutually orthogonal and having a frequency quadruple that of the stereo pilot tone at 19 kHz, i.e. 76 kHz, are obtained in frequency quadruplication section 102 from first and second oscillation ps19, pc19. Third oscillation ps76 is emitted at a first output terminal 114, and fourth oscillation pc76 at a second output terminal 115, of frequency quadruplication section 102.

First multiplication section 103 has the MPX signal delivered to it at its first input terminal 116, and the third oscillation ps76 delivered to it at its second input terminal 117. A first multiplication signal is obtained from these two signals by signal multiplication, and is emitted by first multiplication section 103 at an output terminal 118. In a similar manner, second multiplication section 104 has the MPX signal delivered to it at its first input terminal 119, and the fourth oscillation pc76 delivered to its second input terminal 120, and a second multiplication signal is obtained from these two signals by signal multiplication and is emitted from second multiplication section 104 at an output terminal 121. The first multiplication signal is delivered from output terminal 118 of first multiplication section 103 to an input terminal 122 of first low-pass filter 105, and the second multiplication signal is delivered from output terminal 121 of second multiplication section 104 to an input terminal 123 of second low-pass filter 106. The multiplication signals are low-pass filtered in the respective low-pass filters 105, 106; as a result, a first DARC signal component Q is obtained from the first multiplication signal and a second DARC signal component I is obtained from the second multiplication signal, and are respectively emitted at output terminals 124, 125 of the respective first and second low-pass filter 105, 106. From there, the respective DARC signal components Q and I are delivered to respective input terminals 126, 127 of FM demodulation section 107. In FM demodulation section 107, the DARC signal W is obtained from a frequency demodulation of the first and second DARC signal components Q and I, and is emitted at output terminal 128 of FM demodulation section 107, which at the same time constitutes an output terminal of DARC demodulator 100. Frequency demodulation may be executed in a usual manner, and a phase angle of the DARC signal W is thereby determined from the complex DARC signal components I and Q.

Figure 2:
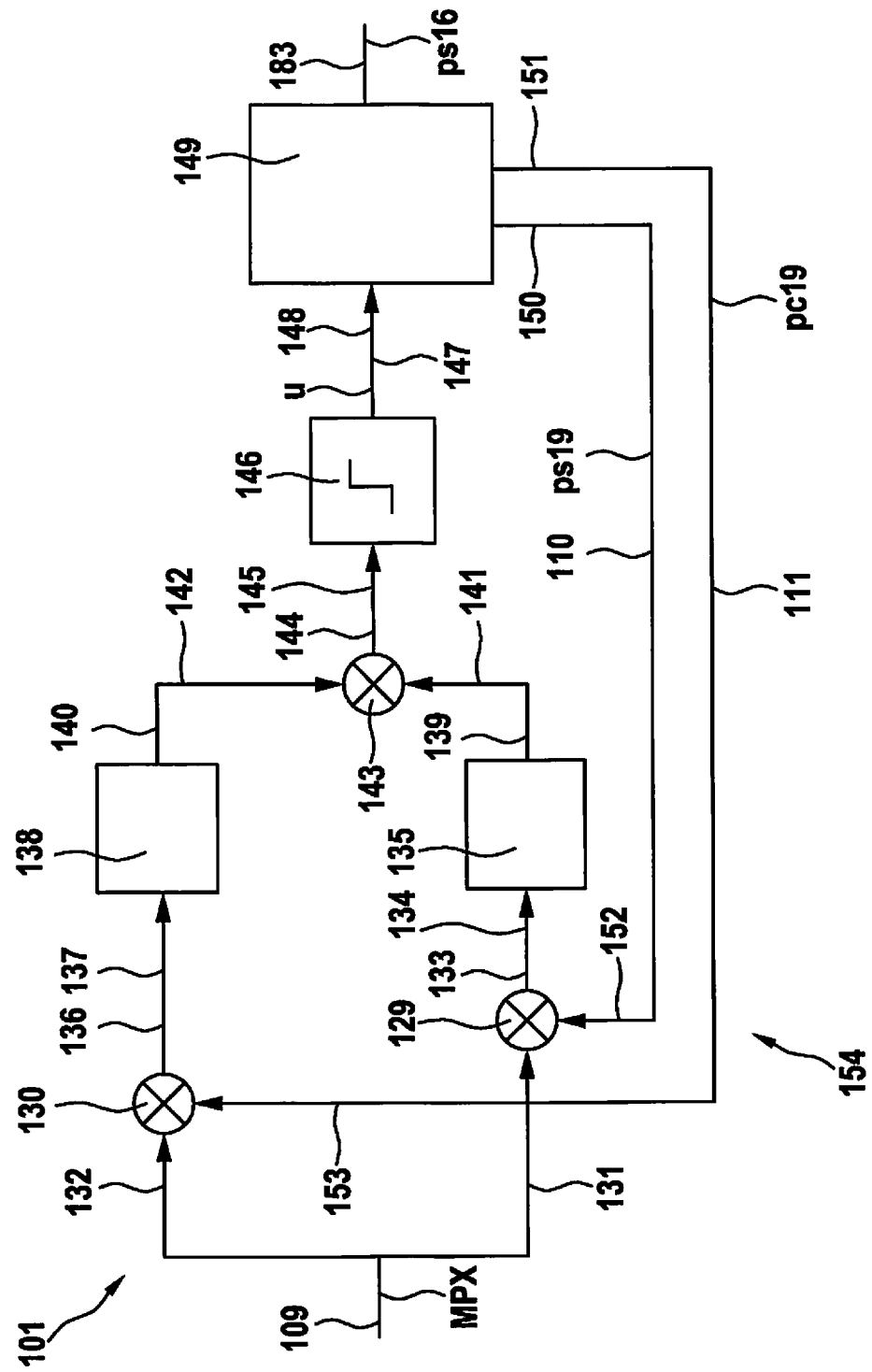
FIG. 2 shows an example of a pilot tone regulation circuit according to the present invention for used in the DARC signal demodulation circuit assemblage according to FIG. 1.

The example in FIG. 2 of a pilot tone regulation circuit 101 according to the present invention for use in the DARC demodulator according to FIG. 1 is embodied with a phase-locked loop to be latched onto the stereo pilot tone so that accurate, stable operation and a simple configuration are achieved, and encompasses for that purpose a third 129 and a fourth multiplication section 130 whose respective first input terminals 131 and 132 are connected to input terminal 109 for delivery of the MPX signal. An output terminal 133 of third multiplication section 129 is connected to an input terminal 134 of a third low-pass filter 135, and an output terminal 136 of fourth multiplication section 130 is connected to an input terminal 137 of a fourth low-pass filter 138. Output terminals 139, 140 respectively of third and fourth low-pass filters 135, 138 are connected respectively to a first 141 and a second input terminal 142 of a fifth multiplication section 143, output terminal 144 of which is connected to an input terminal 145 of a threshold value circuit 146. Multiplication sections 129, 130, 143, low-pass filters 135, 138, and threshold value circuit 146 together constitute a control signal generation section 154. An output terminal 147 of threshold value circuit 146 is connected to an input terminal 148 of an oscillation generator 149. The latter has a first 150 and a second output terminal 151 that are each connected to a respective input terminal 152, 153 respectively of third 129 and fourth multiplication section 130, thus constituting the feedback portion of the phase-locked loop. Output terminals 150, 151 furthermore constitute the respective output terminals 110, 111 of pilot tone circuit 101.

First and second oscillation ps19, pc19 are generated by oscillation generator 149 and are emitted at output terminals 150, 151. From signal multiplication respectively of first and second oscillation ps19, pc19 by the MPX signal respectively in third and fourth multiplication section 129, 130, a third and a fourth multiplication signal are respectively obtained; these are low-pass filtered in order to suppress harmonics and are then combined in fifth multiplication section 143 to yield the fifth multiplication signal, from which a control signal u alternately having the values +1 and −1 is constituted in threshold value circuit 146; that signal is emitted at output terminal 147 to input terminal 148 of oscillation generator 149 in order to constitute, under the control of the control signal u, first and second oscillation ps19, pc19.

Figure 3:
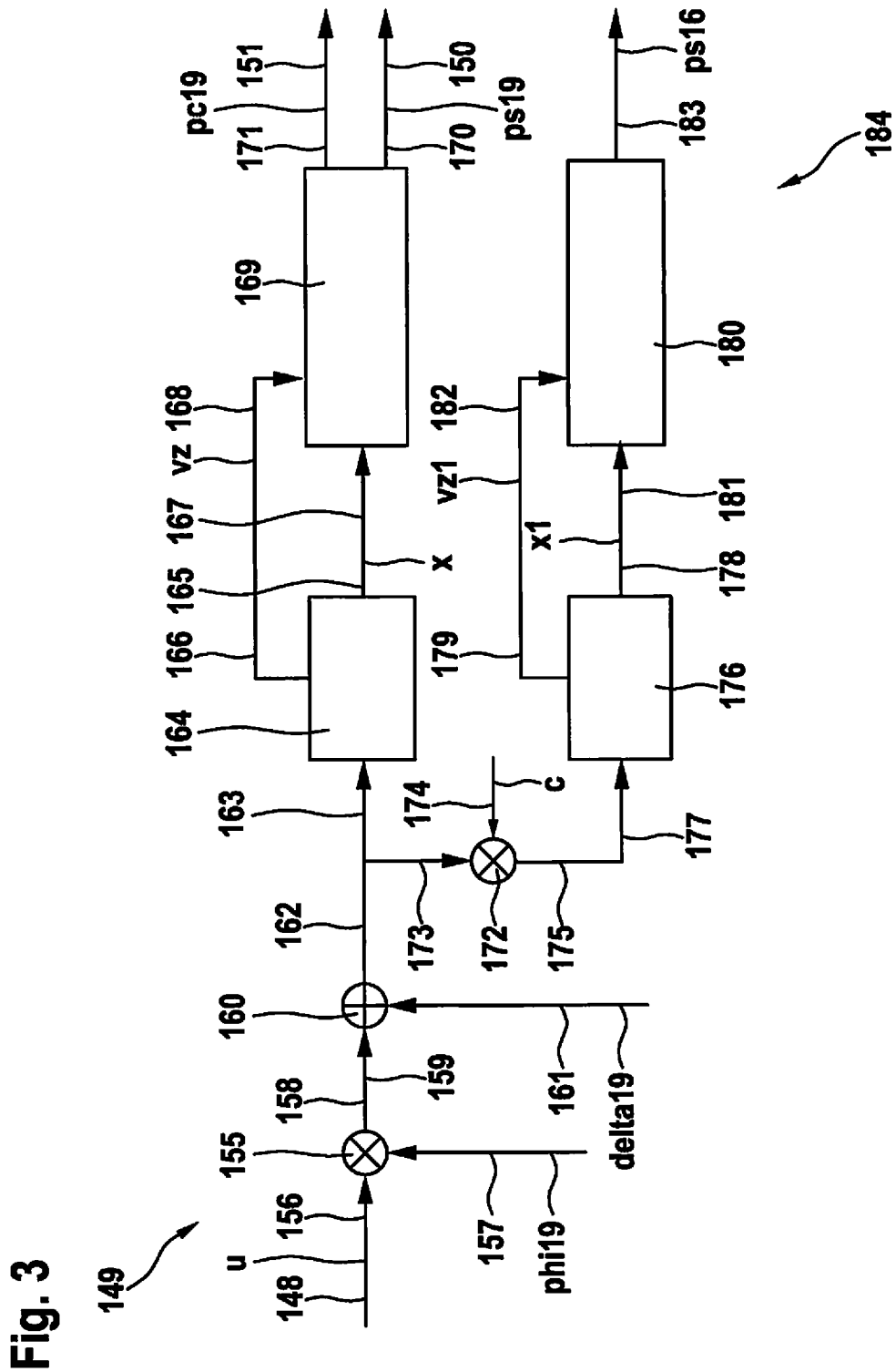
FIG. 3 shows an example of an oscillation generator according to the present invention for use in a pilot tone regulation circuit according to FIG. 2.

FIG. 3 shows an example of an oscillation generator 149 according to the present invention for use in a pilot tone regulation circuit 101 according to FIG. 2. Encompassed therein is a sixth multiplication section 155 whose first input terminal 156 is connected to input terminal 148, and to whose second input terminal 157 a phase error compensation signal phi19 is applied during operation. An output terminal 158 of sixth multiplication section 155 is connected to a first input terminal 159 of an addition section 160, to whose second input terminal 161 an increment signal delta19 is applied during operation. An output terminal 162 of addition section 160 is connected to an input terminal 163 of a first integration section 164 that is connected at an argument output terminal 165 to an argument input terminal 167 and at an overflow output terminal 166 to a sign input terminal 168 of a first polynomial section 169. A first 170 and a second output terminal 171 of first polynomial section 169 are configured to respectively emit first and second oscillation ps19, pc19, and at the same time respectively constitute first 150 and second output terminal 151 of oscillation generator 149.

A sixth multiplication signal is obtained from sixth multiplication section 155 by signal multiplication of the control signal u by the phase error compensation signal phi19, and is added in addition section 160 to the increment signal delta19, thereby generating a sum signal that is integrated in first integration section 164. The first integration section operates in so-called "wrap mode," i.e. it has a limited signal value range within which the signal value at argument output terminal 165 is located. Upon overflow beyond one of the limits of the signal value range, the result continues to count from the other limit. For example, if the signal value range extends from −1 to +1, the result of such an addition is, for example, 0.8+0.3=−0.9. A sign signal vz, which switches over between the values +1 and −1 at each overflow of integration section 164, is emitted at overflow output terminal 166. From these signal values at argument output terminal 165 and from the sign signal vz, signal values for first and second oscillation ps19, pc19 are generated in first polynomial section 169 by way of a polynomial approximation in which the sine and cosine angle functions are represented in an approximate manner by polynomials, as follows:

$$ps19 = \sin(x) = vz^*(a1^*x + a3^*x^3 + a5^*x^5)$$

$$\text{and } pc19 = \cos(x) = vz^*(1 + a2^*x^2 + a4^*x^4),$$

where $x = 2^*pi^*19 \text{ kHz}^*t$,
where pi=the mathematical constant n, t is time, and a1 to a5 are coefficients of the polynomial approximations. A more detailed description of a polynomial approximation of this kind is provided in EP 0 627 834 A1, in particular FIGS. 4 and 5, the disclosure of which is explicitly referenced herewith.

Output terminal 162 of addition section 160 is furthermore connected to a first input terminal 173 of a seventh multiplication section 172 to which, during operation, a scaling signal c having the signal value 16/19 is delivered at a second input terminal 174. A seventh multiplication signal, constituted in seventh multiplication section 172 from the sum signal and from scaling signal c by signal multiplication, is emitted from an output terminal 175 of seventh multiplication section 172 to an input terminal 177 of a second integration section 176 identical in terms of construction and mode of operation to first integration section 164, and integrated in it. A sign signal vz1, which switches over between the values +1 and −1 at each overflow of second integration section 176, is emitted at an overflow output terminal 179. From the signal values at an argument output terminal 178 and from the sign signal vz1, signal values for a clock signal ps16 are generated in a second polynomial section 180, downstream from second integration section 176, by way of a polynomial approximation in which the sine angle function is represented in an approximate manner by a polynomial, as follows:

$$ps16 = \sin(x1) = vz1^*(a1^*x1 + a3^*x1^3 + a5^*x1^3),$$

where $x1 = 2^*pi^*16 \text{ kHz}^*t$.

By scaling with the scaling signal c, an increment decreased by a factor of 16/19 with respect to the sum signal at input terminal 163 of first integration section 164 is delivered to second integration section 176, and the clock signal ps16 having a frequency of 16 kHz is generated therefrom in a frequency- and phase-accurate manner with respect to the stereo pilot tone, so that slaving of the control signal u to the frequency- and phase-accurate regulation of first and second oscillation ps19, pc19 automatically also produces a correction of the clock signal ps16, and is emitted at an output terminal 183 of second polynomial section 180. This enables simple and accurate derivation of and conformity with the desired frequency and phase of the clock signal ps16 as compared with the stereo pilot tone, and also yields precise operation upon subsequent recovery of the DARC data data from the DARC signal W and upon subsequent DARC decoding. Second integration section 176 and second polynomial section 180 together constitute a clock signal derivation section 184 coupled to pilot tone regulation circuit 101.

A clock signal shaping section 185 is connected to output terminal 183 of second polynomial section 180 in order to shape the clock signal, for example to smooth or low-pass filter the time course thereof. For accurate adaptation of the phase relationship between the clock signal ps16 and DARC signal W, the clock signal for obtaining the DARC data from the DARC signal W is conveyed via a propagation time element 186, particularly having an adjustable signal propagation time, to a DARC data recovery section 187 whose clock input 188 is connected via propagation time element 186 to clock signal shaping section 185. In DARC data recovery section 187, a quality signal quali is also obtained in addition to the DARC data data. For this, the demodulated DARC signal W is summed in a short-duration integrator over the duration of one period of the clock signal ps16, the result is compared with a signal threshold value, and the present value of that data bit of the DARC data data which is to be detected is determined therefrom. The quality signal quali is ascertained, by a corresponding comparison of the short-duration integration result with a quality threshold value, for each bit of the DARC data data, thus providing information regarding the signal, i.e. reception quality and thus the reliability of the DARC data. The DARC data data and the quality signal quali are delivered for further processing to a DARC decoder 189 connected to DARC data recovery section 187.

Figure 4:
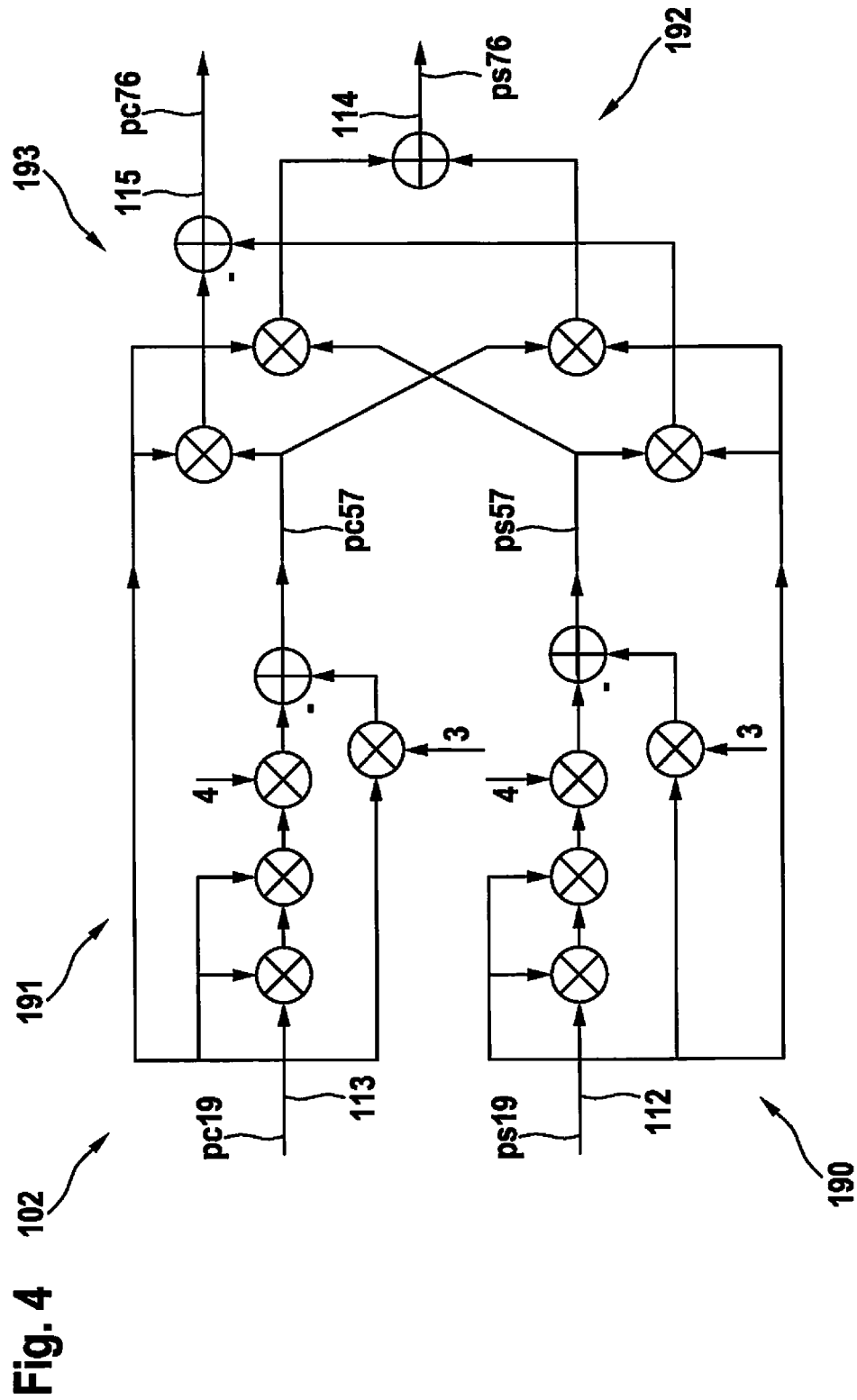
FIG. 4 shows an example of a frequency quadruplication section according to the present invention for use in the DARC signal demodulation circuit assemblage according to FIG. 1.

FIG. 4 shows an example of a frequency quadruplication section 102 according to the present invention for use in DARC demodulator 100 according to FIG. 1. In it, frequency quadruplication is performed by applying the following sine and cosine addition theorems:

$$ps57 = \sin(2^*pi^*57 \text{ kHz}^*t) = \sin(3^*2^*pi^*19 \text{ kHz}^*t) = 3^*ps19 - 4^*(ps19)^3$$

$$pc57 = \cos(2^*pi^*57 \text{ kHz}^*t) = \cos(3^*2^*pi^*19 \text{ kHz}^*t) = 4^*(pc19) - 3^*pc19$$

$$\text{and } ps76 = \sin(2^*pi^*76 \text{ kHz}^*t) = ps19^*pc57 + pc19^*ps57 pc76 = \cos(2^*pi^*76 \text{ kHz}^*t) = pc19^*pc57 - ps19^*ps57.$$

ps57 and pc57 here are respectively first and second signals that occur as intermediate results in the context of signal recovery using the addition theorems. Specifically, in a first section 190 of frequency quadruplication section 102, according to the first of the equations above, in two multiplication steps downstream from each other the first oscillation ps19 is raised to the third power and is multiplied in a multiplication step by a constant factor having a value of 4; in addition, the first oscillation ps19 is multiplied in a multiplication step by a constant factor having the value of 3, and the two signals thereby obtained are subtracted from one another in a subtraction step, so that the first intermediate result signal ps57 is obtained. In the same manner, in a second section 191 of frequency quadruplication section 102, according to the second of the equations above, in two multiplication steps downstream from each other the second oscillation pc19 is raised to the third power and is multiplied in a multiplication step by a constant factor having the value of 4; in addition, the second oscillation pc19 is multiplied in a multiplication step by a constant factor having the value of 3, and the two signals thereby obtained are subtracted from one another in a subtraction step so that the second intermediate result signal pc57 is obtained. In a downstream third section 192, first oscillation ps19 is multiplied by the second intermediate result signal pc57, and second oscillation pc19 is multiplied by the first intermediate result signal ps57, each in a multiplication step, and these multiplication results are additively overlaid in an addition step to yield the third oscillation ps76. In a fourth section 193 that is also downstream, the second oscillation pc19 is multiplied by the second intermediate result signal pc57, and the first oscillation ps19 is multiplied by the first intermediate result signal ps57, each in a multiplication step, and these multiplication results are overlaid in a subtraction step to yield the fourth oscillation pc76.

The "LIST OF REFERENCE CHARACTERS" is as follows:
100 DARC signal demodulation circuit assemblage (DARC demodulator)
101 Pilot tone regulation circuit in 100
102 Frequency quadruplication section in 100
103 First multiplication section in 100
104 Second multiplication section in 100
105 First low-pass filter in 100
106 Second low-pass filter in 100
107 FM demodulation section in 100
108 Input terminal of DARC demodulator 100
109 Input terminal of pilot tone regulation circuit 101
110 First output terminal of 101 for ps19
111 Second output terminal of 101 for pc19
112 First input terminal of 102 for ps19
113 Second input terminal of 102 for pc19
114 First output terminal of 102 for ps76
115 Second output terminal of 102 for pc76
116 First input terminal of 103 for MPX
117 Second input terminal of 103 for ps76
118 Output terminal of 103 for first multiplication signal
119 First input terminal of 104 for MPX
120 Second input terminal of 104 for pc76
121 Output terminal of 104 for second multiplication signal
122 Input terminal of 105 for first multiplication signal
123 Input terminal of 106 for second multiplication signal
124 Output terminal of 105 for low-pass-filtered first multiplication signal
125 Output terminal of 106 for low-pass-filtered second multiplication signal
126 First input terminal of 107 for Q
127 Second input terminal of 107 for I
128 Output terminal of 107 for W
129 Third multiplication section in 101
130 Fourth multiplication section in 101
131 First input terminal of 129 for MPX
132 First input terminal of 130 for MPX
133 Output terminal of 129 for third multiplication signal
134 Output terminal of 135 for third multiplication signal
135 Third low-pass filter in 101
136 Output terminal of 130 for fourth multiplication signal
137 Output terminal of 138 for fourth multiplication signal
138 Fourth low-pass filter in 101
139 Output terminal of 135 for low-pass-filtered third multiplication signal
140 Output terminal of 138 for low-pass-filtered fourth multiplication signal
141 First input terminal of 143
142 Second input terminal of 143
143 Fifth multiplication section in 101
144 Output terminal of 143
145 Input terminal of 146
146 Threshold value circuit of 101
147 Output terminal of 146
148 Input terminal of 149
149 Oscillation generator in 101
150 First output terminal of 149 for ps19
151 Second output terminal of 149 for pc19
152 Second input terminal of 129
153 Second input terminal of 130
154 Control signal generation section of 101 (made up of 129, 130, 135, 138, 143, 146)
155 Sixth multiplication section in 149
156 First input terminal of 155 in 149
157 Second input terminal of 155 in 149 for phi19
158 Output terminal of 155 in 149 for sixth multiplication signal
159 First input terminal of 160 in 149
160 Addition section in 149
161 Second input terminal of 160 in 149 for delta19
162 Output terminal of 160 in 149 for sum signal
163 Input terminal of 164 in 149 for sum signal
164 First integration section in 149
165 Argument output terminal of 164 in 149
166 Overflow output terminal of 164 in 149
167 Argument input terminal of 169 in 149
168 Sign input terminal of 169 in 149
169 First polynomial section in 149
170 First output terminal of 169 in 149 for emission of ps19
171 Second output terminal of 169 in 149 for emission of pc19
172 Seventh multiplication section 149
173 First input terminal of 172 in 149
174 Second input terminal of 172 in 149
175 Output terminal of 172 in 149 for seventh multiplication signal
176 Second integration section in 149
177 Input terminal of 176 in 149 for seventh multiplication signal
178 Argument output terminal of 176 in 149
179 Overflow output terminal of 176 in 149
180 Second polynomial section in 149
181 Argument input terminal of 180 in 149
182 Sign input terminal of 180 in 149
183 Output terminal of 180 in 149 for emission of ps16
184 Clock signal derivation section in 149
185 Clock signal shaping section
186 Propagation time element
187 DARC data recovery section
188 Clock input of 187
189 DARC decoder
190 First section in 102
191 Second section in 102
192 Third section in 102
193 Fourth section in 102
a1 Coefficient of series expansion for sine function
a2 Coefficient of series expansion for cosine function
a3 Coefficient of series expansion for sine function
a4 Coefficient of series expansion for cosine function a5 Coefficient of series expansion for sine function
c Scaling signal (c=16/19)
data DARC data of 187
delta19 Increment signal at 161 of 160 in 149
I Second DARC signal component at 124, 126
MPX FM multiplex transmission signal (MPX signal)
phi19 Phase error compensation signal at 157 of 155 in 149
pc19 Second oscillation at 19 kHz at 111 and 151
pc57 Second intermediate result signal in 102
pc76 Fourth oscillation at 76 kHz at 115
ps16 Clock signal at 16 kHz at 183 of 180
ps19 First oscillation at 19 kHz at 110 and 150
ps57 First intermediate result signal in 102
ps76 Third oscillation at 76 kHz at 114
Q First DARC signal component at 125, 127
quali Quality signal of 187
t Time
u Control signal (u=+/−1)
vz Sign signal at 166 of 164 (vz=+/−1)
vz1 Sign signal at 179 of 176 (vz1=+/−1)
W DARC signal
x Argument of angle functions (x=2*pi*19 kHz*t)
x1 Argument of angle functions (x1=2*pi*16 kHz*t)

What is claimed is:

1. A Data Radio Channel (DARC) signal demodulation circuit assemblage for recovering a DARC signal, containing DARC data, from an FM multiplex transmission signal, comprising:
a pilot tone regulation circuit;
a frequency quadruplication circuit;
a multiplication component;
a low-pass filter; and
an FM demodulator;
wherein:
the pilot tone regulation circuit is configured to obtain a first oscillation and a second oscillation that are orthogonal to each other and are synchronous with a stereo pilot tone encompassed by the FM multiplex transmission signal;
the frequency quadruplication circuit is operatively coupled to the pilot tone regulation circuit to receive the first and second oscillations and is configured to obtain, based on the received first and second oscillations, a third oscillation and a fourth oscillation that are orthogonal to each other and have a frequency quadrupled with respect to the stereo pilot tone;
the multiplication component is operatively coupled to the frequency quadruplication circuit to receive the third oscillation and the fourth oscillation from the frequency quadruplication circuit, and the multiplication component is configured to obtain a first multiplication signal from the FM multiplex transmission signal and from the third oscillation received from the frequency quadruplication circuit and obtain a second multiplication signal from the FM multiplex transmission signal and from the fourth oscillation received from the frequency quadruplication circuit;
the low-pass filter is operatively coupled to the multiplication component to receive the first and second multiplication signals from the multiplication component, and the low-pass filter is configured to obtain a first DARC signal component by low-pass filtration of the first multiplication signal received from the multiplication component and obtain a second DARC signal component by low-pass filtration of the second multiplication signal received from the multiplication component; and
the FM demodulator is operatively coupled to the low-pass filter to receive the first and second DARC signal components and is configured to obtain the DARC signal from a frequency demodulation of the received first and second DARC signal components.

2. The DARC signal demodulation circuit assemblage of claim 1, wherein the pilot tone regulation circuit is configured with a phase-locked loop to be latched onto the stereo pilot tone.

3. The DARC signal demodulation circuit assemblage of claim 1, wherein the pilot tone regulation circuit is configured to derive, in a frequency- and phase-accurate manner with respect to the stereo pilot tone, a clock signal for obtaining the DARC data from the DARC signal.

4. The DARC signal demodulation circuit assemblage of claim 3, further comprising a propagation time element that is downstream from the pilot tone regulation circuit and is configured to delay the clock signal derived by the pilot tone regulation circuit by an amount equal to a predefinable signal propagation time.

5. The DARC signal demodulation circuit assemblage of claim 1, wherein the pilot tone regulation circuit:
is configured to:
obtain a third multiplication signal from the FM multiplex transmission signal and from the first oscillation;
obtain a fourth multiplication signal from the FM multiplex transmission signal and from the second oscillation;
obtain a fifth multiplication signal from the third and fourth multiplication signals; and
generate a control signal from the fifth multiplication signal; and
includes an oscillation generator, the oscillation generator being configured to generate the first and second oscillations, in a manner controlled by the control signal, by polynomial approximation.

6. The DARC signal demodulation circuit assemblage of claim 1, wherein the DARC signal demodulation circuit assemblage is in an FM multiplex broadcast receiver.

7. A method for operating a Data Radio Channel (DARC) signal demodulation circuit assemblage to recover a DARC signal, containing DARC data, from a FM multiplex transmission signal, the method comprising:
obtaining a first oscillation and a second oscillation that are orthogonal to each other and are synchronous with a stereo pilot tone encompassed by the FM multiplex transmission signal;
obtaining, based on the first and second oscillations and by frequency quadruplication, a third oscillation and a fourth oscillation that are orthogonal to each other and that have quadruple the frequency of the stereo pilot tone;
obtaining a first multiplication signal from the FM multiplex transmission signal and from the third oscillation by signal multiplication;
obtaining a second multiplication signal from the FM multiplex transmission signal and from the fourth oscillation;
obtaining, by low-pass filtration, a first DARC signal component from the first multiplication signal;
obtaining a second DARC signal component from the second multiplication signal; and obtaining the DARC signal from a frequency demodulation of the first signal component and the second DARC signal component.

8. The method of claim 7, wherein a clock signal for obtaining the DARC data from the DARC signal is derived from the stereo pilot tone in frequency- and phase-accurate fashion with respect to the stereo pilot tone.

9. A non-transitory computer readable medium on which is stored a computer program that is executable by a processor and that, when executed, causes the processor to operate a Data Radio Channel (DARC) signal demodulation circuit assemblage to recover a DARC signal, containing DARC data, from a FM multiplex transmission signal, by performing the following:
  obtaining a first oscillation and a second oscillation that are orthogonal to each other and are synchronous with a stereo pilot tone encompassed by the FM multiplex transmission signal;
  obtaining, based on the first and second oscillations and by frequency quadruplication, a third oscillation and a fourth oscillation that are orthogonal to each other and have quadruple the frequency of the stereo pilot tone;
  obtaining a first multiplication signal from the FM multiplex transmission signal and from the third oscillation by signal multiplication;
  obtaining a second multiplication signal from the FM multiplex transmission signal and from the fourth oscillation;
  obtaining, by low-pass filtration, a first DARC signal component from the first multiplication signal;
  obtaining a second DARC signal component from the second multiplication signal; and
  obtaining the DARC signal from a frequency demodulation of the first DARC signal component and the second DARC signal component.

10. The computer readable medium of claim 9, wherein a clock signal for obtaining the DARC data from the DARC signal is derived from the stereo pilot tone in frequency- and phase-accurate fashion with respect to the stereo pilot tone.

11. A Data Radio Channel (DARC) signal demodulation circuit for recovering a DARC signal that includes DARC data, the circuit comprising:
  a receiving interface; and
  processing circuitry, wherein the processing circuitry is configured to:
    receive via the receiving interface an FM multiplex transmission signal;
    generate a first oscillation and a second oscillation that are orthogonal to each other and are synchronous with a stereo pilot tone encompassed by the received FM multiplex transmission signal;
    generate, based on the first and second oscillations, a third oscillation and a fourth oscillation that are orthogonal to each other and have a frequency quadrupled with respect to the stereo pilot tone;
    generate a first multiplication signal from the FM multiplex transmission signal and from the third oscillation;
    generate a second multiplication signal from the FM multiplex transmission signal and from the fourth oscillation;
    generate a first DARC signal component by low-pass filtration of the first multiplication signal;
    generate a second DARC signal component by low-pass filtration of the second multiplication signal; and
    perform a frequency demodulation of the first and second DARC signal components to generate the DARC signal.

* * * * *